United States Patent
Yang et al.

(10) Patent No.: US 8,841,668 B2
(45) Date of Patent: Sep. 23, 2014

(54) ARRAY SUBSTRATE AND METHOD OF MANUFACTURING THE SAME

(75) Inventors: Byung-Duk Yang, Yongin-si (KR); Eun-Guk Lee, Seoul (KR); Se-Hwan Yu, Asan-si (KR); Kyoung-Tai Han, Suwon-si (KR); Su-Hyoung Kang, Bucheon-si (KR); Kyung-Sook Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 212 days.

(21) Appl. No.: 12/415,002

(22) Filed: Mar. 31, 2009

(65) Prior Publication Data

US 2010/0123137 A1    May 20, 2010

(30) Foreign Application Priority Data

Nov. 14, 2008  (KR) .......................... 10-2008-0113252

(51) Int. Cl.
*H01L 29/04*    (2006.01)
*H01L 21/00*    (2006.01)
*H01L 27/12*    (2006.01)
*H01L 29/786*   (2006.01)

(52) U.S. Cl.
CPC ...... *H01L 29/78633* (2013.01); *H01L 27/1214* (2013.01)
USPC .......................................................... 257/59

(58) Field of Classification Search
USPC .......................................................... 257/59
See application file for complete search history.

(56) References Cited

U.S. PATENT DOCUMENTS

| | | | |
|---|---|---|---|
| 6,940,573 B2 * | 9/2005 | Um et al. | 349/129 |
| 7,202,498 B2 * | 4/2007 | Kim | 257/59 |
| 2006/0028598 A1 * | 2/2006 | Lee et al. | 349/107 |
| 2006/0087598 A1 * | 4/2006 | Lee et al. | 349/41 |
| 2007/0195213 A1 * | 8/2007 | Oh | 349/38 |
| 2007/0229734 A1 | 10/2007 | Ho | |
| 2007/0292998 A1 * | 12/2007 | Yu et al. | 438/167 |

FOREIGN PATENT DOCUMENTS

| | | |
|---|---|---|
| JP | 11212075 | 8/1999 |
| JP | 2002258267 | 9/2002 |
| JP | 2004219529 | 8/2004 |
| JP | 2004219827 A | 8/2004 |
| JP | 2006113261 | 4/2006 |
| JP | 2008107812 A | 5/2008 |
| KR | 1020040104799 A | 12/2004 |
| KR | 1020050049985 A | 5/2005 |
| KR | 1020070019169 A | 2/2007 |
| KR | 1020070045379 A | 5/2007 |
| KR | 100772940 B | 10/2007 |

* cited by examiner

*Primary Examiner* — Robert Carpenter
(74) *Attorney, Agent, or Firm* — Cantor Colburn LLP

(57) ABSTRACT

An array substrate includes; a substrate, a gate line and a data line disposed on the substrate, a thin film transistor ("TFT") electrically connected to the gate line and the data line, a light blocking member disposed on the substrate and a first color filter and a second color filter disposed on the substrate. The light blocking member covers a portion of the first color filter and the second color filter covers a portion of the light blocking member.

12 Claims, 15 Drawing Sheets

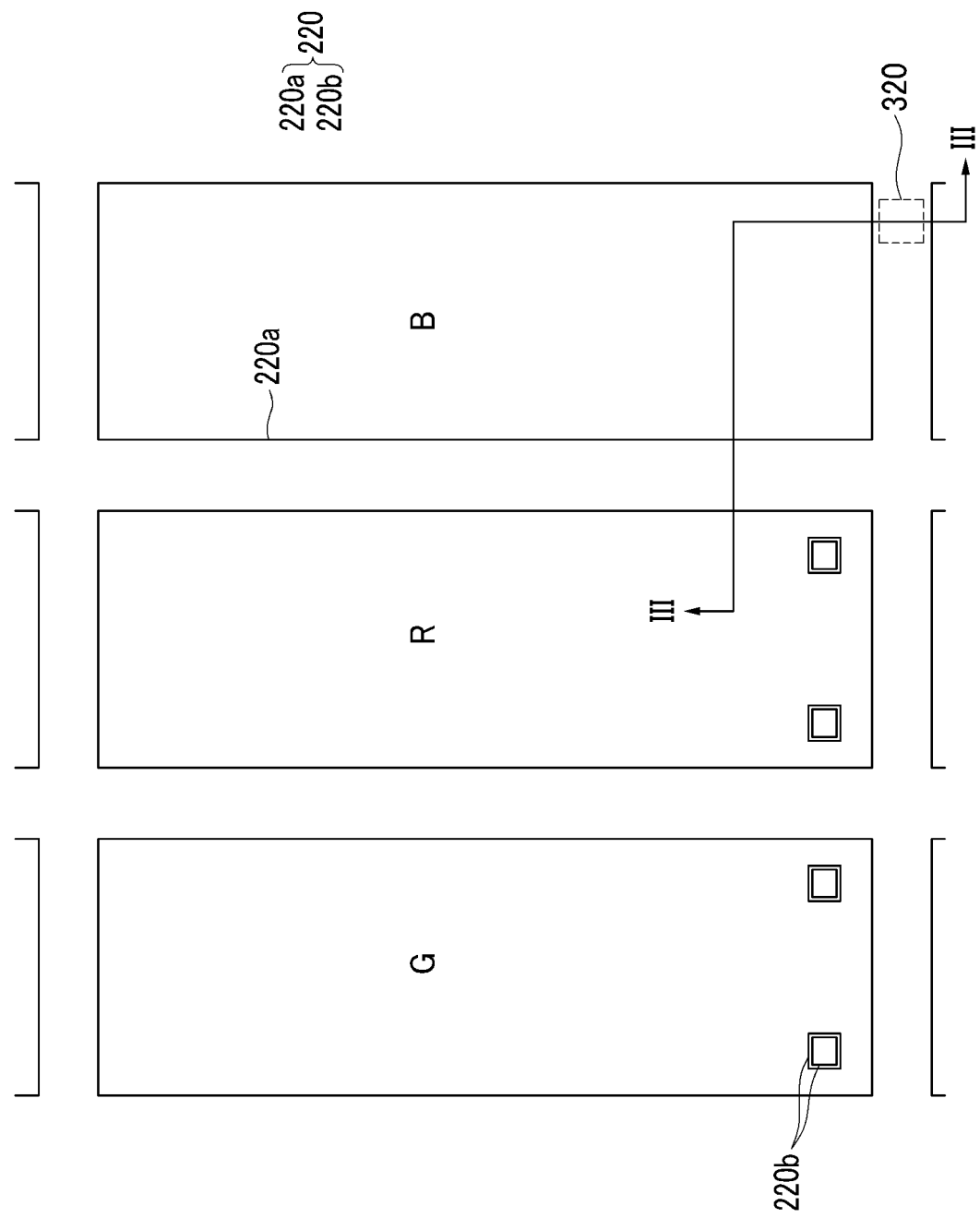

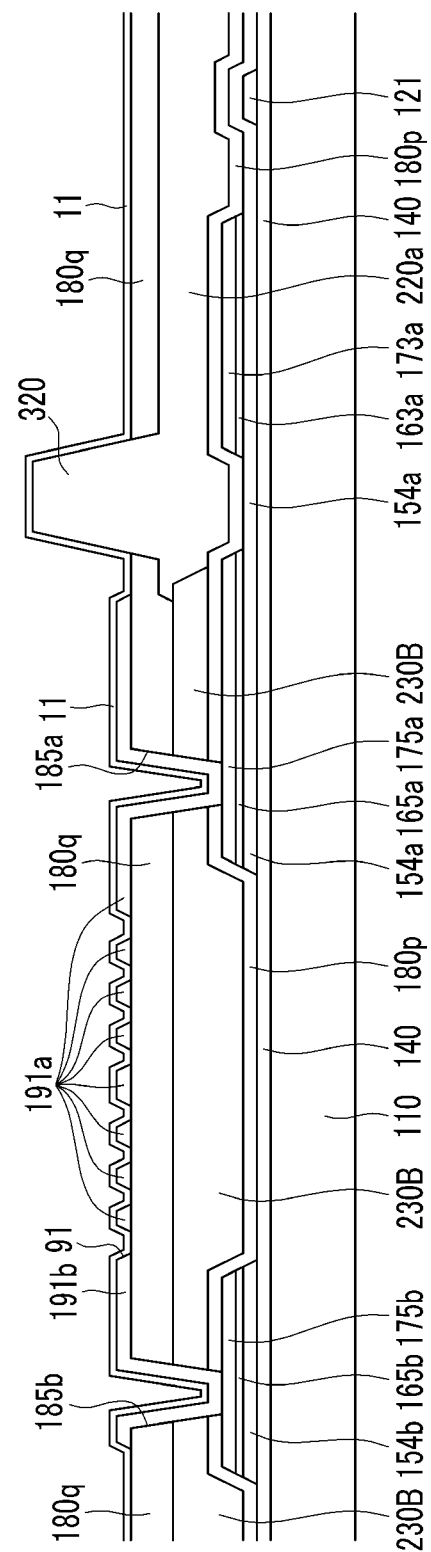

ARRAY SUBSTRATE AND METHOD OF MANUFACTURING THE SAME

The present application claims priority from Korean Patent Application No. 10-2008-0113252, filed on Nov. 14, 2008, and all the benefits accruing therefrom under 35 U.S.C. §119, the contents of which in its entirety are herein incorporated by reference.

BACKGROUND OF THE INVENTION

1. Technical Field

The present disclosure relates to an array substrate and method of manufacturing the same, and more particularly, to an array substrate having an enhanced display quality.

2. Discussion of the Related Art

A liquid crystal display ("LCD") device, which is one type of flat panel display device, includes an array substrate, an opposite substrate facing the array substrate and a liquid crystal layer interposed between the array substrate and the opposite substrate.

A Color-filter On Array ("COA") technology for forming a color filter on the array substrate is used to enhance transmittance of the LCD device by preventing a misalignment between the array substrate and a color filter formed on an opposite substrate.

In order to employ the COA technology on the array substrate, a thin film transistor ("TFT") layer including a TFT is formed on a substrate, a color photo-resist layer is formed on the TFT layer, and a color filter is formed in a pixel area by patterning the color photo-resist layer. Then, a pixel electrode is formed and is electrically connected to the TFT that is formed in the pixel area where the color filter is formed so that a COA substrate is formed. The opposite substrate facing the COA substrate where the color filter is formed typically includes a common electrode facing the pixel electrode and a light blocking member.

When the COA substrate is combined with the opposite substrate where the light blocking member is formed, miss-alignment may occur. Therefore, a Black matrix On Array ("BOA") Technology for forming the light blocking member on the COA substrate has been developed to prevent the miss-alignment.

When the color filter and the light blocking member are formed on the array substrate, the color filter may be formed by an ink-jet process, and a spacing member may be formed when the light blocking member is formed.

With regard to the ink-jet process, in order to produce a color display, a plurality of color filters including a red color filter, a green color filter and a blue color filter are formed by dispensing a liquid ink in a predetermined area so that manufacturing time and manufacturing cost can be reduced.

However, the formation of the spacing member after the light blocking member requires additional manufacturing steps, thereby complicating the manufacturing process and leading to additional manufacturing costs.

BRIEF SUMMARY OF THE INVENTION

Exemplary embodiments of the present invention provide an array substrate having an enhanced display quality and a method of manufacturing the same.

According to an exemplary embodiment of the present invention, an array substrate includes; a substrate, a gate line and a data line disposed on the substrate, a thin film transistor ("TFT") electrically connected to the gate line and the data line, a light blocking member disposed on the substrate, and a first color filter and a second color filter disposed on the substrate, wherein the light blocking member overlaps a portion of the first color filter and the second color filter overlaps a portion of the light blocking member.

In one exemplary embodiment, the array substrate may further include a spacing member disposed on at least one of the first color filter and second color filter, wherein the spacing member includes substantially the same material as the light blocking member.

In one exemplary embodiment, the first color filter is disposed by a photolithography process and the spacing member is disposed on at least a portion of the first color filter.

In one exemplary embodiment, the array substrate may further include a protection layer disposed on the light blocking member and the color filter, and a pixel electrode disposed on the protection layer, wherein the pixel electrode is connected to the TFT.

In one exemplary embodiment, the pixel electrode may comprise a first pixel electrode connected to the thin film transistor through a first contact hole which penetrates the protection layer and a second pixel electrode connected to a second TFT through a second contact hole which penetrates the first color filter and the protection layer.

In one exemplary embodiment, the second color filter may be formed by an ink-jet process and fills an inner area surrounded by the light blocking member, and wherein the light blocking member may include a first portion disposed along with the gate line and the data line, and a second portion surrounding the first contact hole.

In one exemplary embodiment, the second portion may have a square ring shape, and the second color filter may not be disposed in an inner area of the square shape.

According to another exemplary embodiment of the present invention, an array substrate includes; a substrate, a gate line and a data line disposed on the substrate, a thin film transistor ("TFT") electrically connected to the gate line and the data line, a light blocking member disposed on the substrate, a plurality of color filters disposed on the substrate, and a spacing member disposed on a first group of the color filters, wherein a second group of the color filters is formed by an ink-jet process and fills an area bound by the light blocking member, and the spacing member is contiguous with the light blocking member.

In one exemplary embodiment, the first group of the color filters may be formed by a photolithography process.

According to another exemplary embodiment of the present invention, a method of manufacturing an array substrate includes; disposing a thin film transistor ("TFT") on a substrate, disposing a lower protection layer on the substrate including the TFT, disposing a first color filter on the lower protection layer by a photolithography process, disposing a light blocking member and a spacing member on the lower protection layer and the first color filter and ink-jetting a second color filter onto the lower protection layer using the light blocking member as a partition.

In one exemplary embodiment, the light blocking member and the spacing member may be formed substantially simultaneously.

In one exemplary embodiment, forming the light blocking member and the spacing member may include; coating a photosensitive resist on the lower protection layer and the first color filter, exposing the photosensitive resist through a mask and developing the photosensitive resist, wherein the mask may include a transparent area, a translucent area and a light blocking area.

In one exemplary embodiment, the photosensitive resist may include a negative photosensitive property, and the transparent area corresponds to an area where the spacing member is disposed, the translucent area corresponds to an area where the light blocking member is formed, and the light blocking area corresponds to an area where the spacing member and the light blocking member are not formed.

In one exemplary embodiment, the photosensitive resist may include a positive photosensitive property, and the light blocking area corresponds to an area where the spacing member is disposed, the translucent area corresponds to an area where the light blocking member is formed, and the transparent area corresponds to an area where the spacing member and the light blocking member are not formed.

In one exemplary embodiment, disposing the TFT may include disposing a gate line including a gate electrode, disposing a gate insulation layer on the gate line, disposing a semiconductor layer and an ohmic contact layer on the gate insulation layer, disposing a data line layer including a source electrode and a drain electrode on the ohmic contact layer, disposing an upper protection layer on the light blocking member and the first and second color filters and disposing a pixel electrode connected to the drain electrode through a contact hole.

In one exemplary embodiment, the light blocking member may include a first portion disposed along with the gate line and the data line and a second portion surrounding the contact hole.

In one exemplary embodiment, the second portion may have a square ring shape, and the second color filter may not be formed in an inner area surrounded by the second portion.

BRIEF DESCRIPTION OF THE DRAWINGS

Exemplary embodiments of the present invention can be understood in more detail from the following descriptions taken in conjunction with the accompanying drawings, in which:

FIG. 3a is a top plan layout view of an exemplary embodiment of an array substrate according to the present invention;

FIG. 3b is a cross-sectional view taken along line III-III of FIG. 3a;

FIG. 4 is a cross-sectional view taken along line IV-IV of FIG. 2;

DETAILED DESCRIPTION OF THE INVENTION

Figure 1:
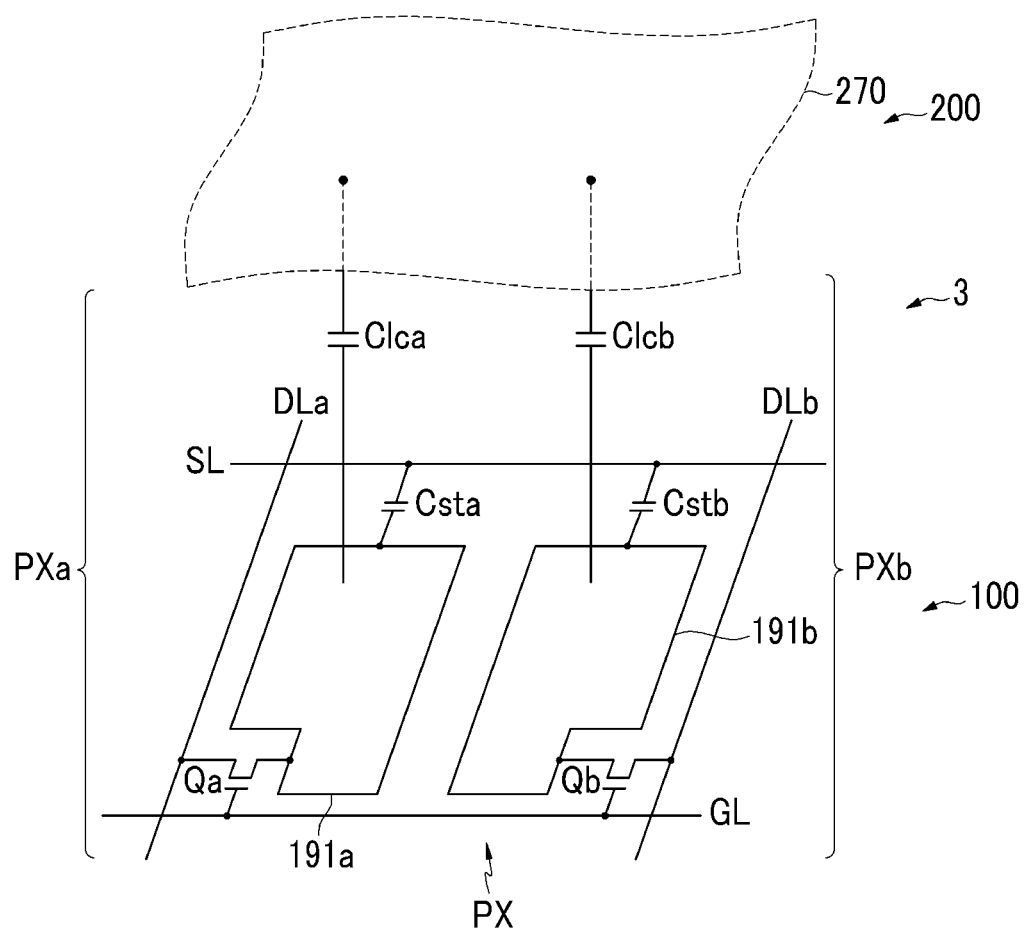
FIG. 1 is a schematic perspective view illustrating an exemplary embodiment of a pixel of an exemplary embodiment of an LCD panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is a schematic perspective view illustrating an exemplary embodiment of a pixel of an exemplary embodiment of an LCD panel according to the present invention.

Referring to FIG. 1, a display panel includes an array substrate 100, an opposite substrate 200 facing the array substrate 100 and a liquid crystal layer 3 interposed between the array substrate 100 and the opposite substrate 200.

The array substrate 100 includes a plurality of gate lines GLa, a plurality of data lines DLa, DLb disposed substantially perpendicular to the gate lines, a storage line SL and a plurality of pixels PX.

In the present exemplary embodiment, each of the pixels PX includes a pair of sub-pixels PXa, PXb. The sub-pixels PXa, PXb include switching elements Qa, Qb, liquid crystal capacitors Clca, Clcb and storage capacitors Csta, Cstb, respectively.

In one exemplary embodiment, the switching elements Qa, Qb may be thin film transistors ("TFTs"). A control terminal of the switching elements Qa, Qb is connected to the gate lines GL, an input terminal of the switching elements Qa, Qb is connected to the data lines DLa, DLb, and an output terminal of the switching elements Qa, Qb is connected to the liquid crystal capacitors Clca, Clcb and storage capacitors Csta, Cstb.

The liquid crystal capacitors Clca, Clcb include sub-pixel electrodes 191a, 191b, a common electrode 270 and the liquid crystal layer 3 interposed between the sub-pixel electrodes 191a, 191b and the common electrode 270.

The storage capacitors Csta, Cstb include the storage line SL formed on the array substrate 100, the sub-pixel electrodes 191a, 191b and an insulation layer interposed between the storage line SL and the sub-pixel electrodes 191a, 191b. The storage line SL receives a reference voltage, which in one exemplary embodiment may be a common voltage Vcom.

Figure 2:
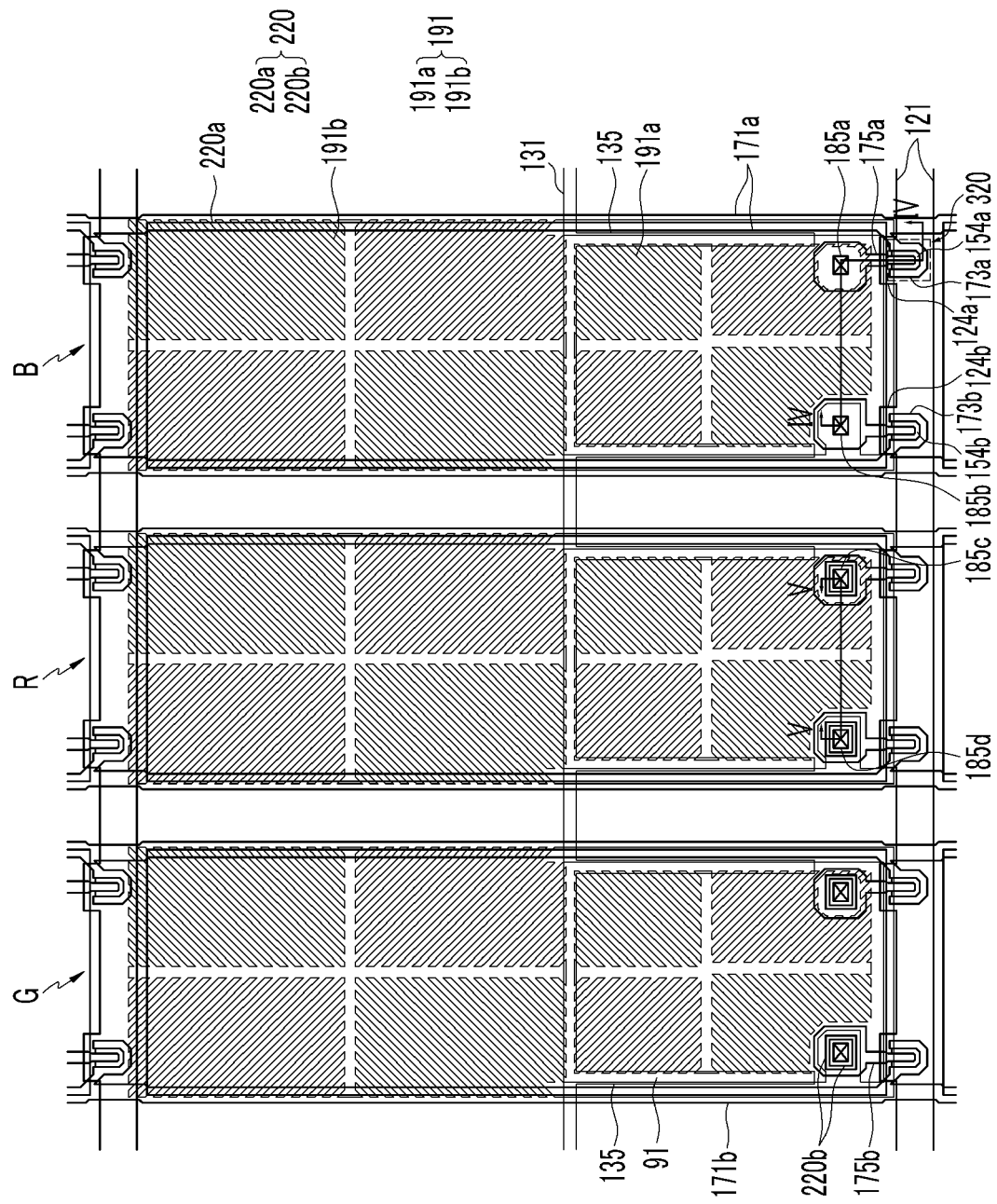
FIG. 2 is a top plan layout view of an exemplary embodiment of an array substrate according to the present invention.
Figure 3B:
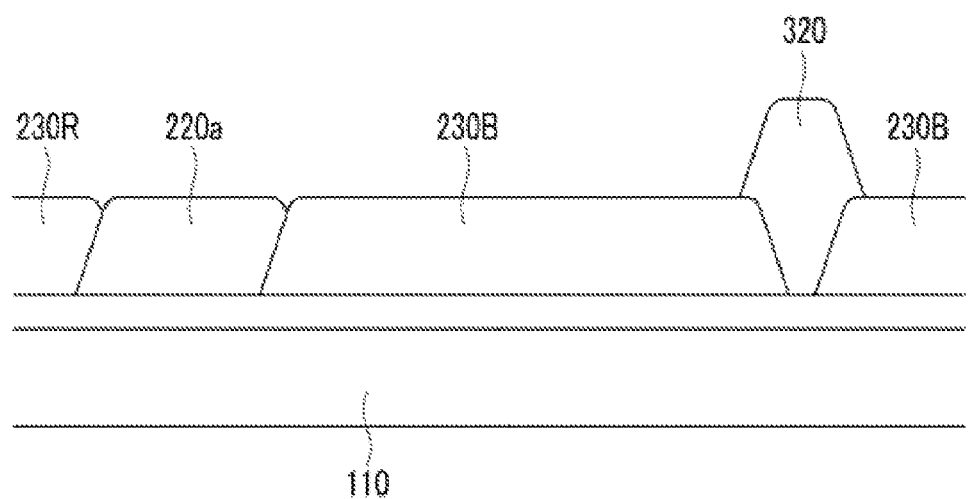
Figure 5:
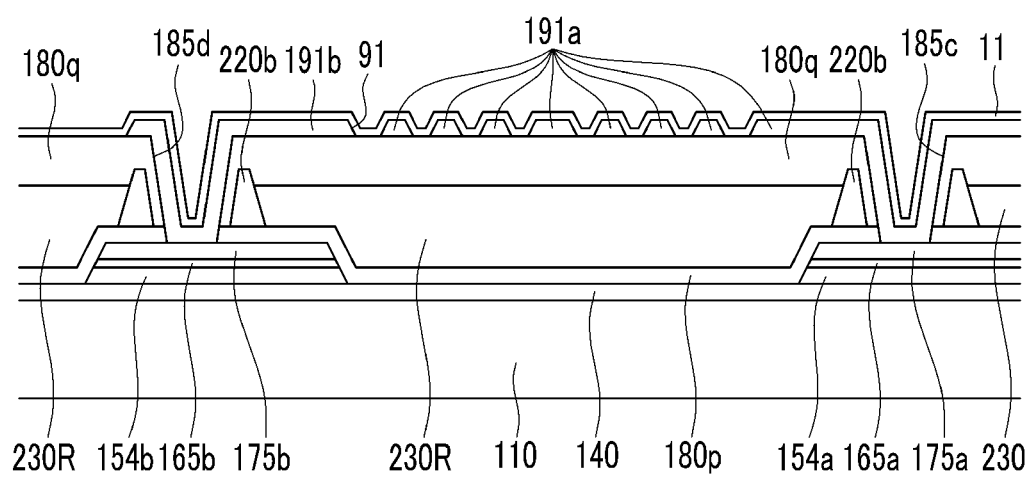
FIG. 5 is a cross-sectional view taken along line V-V of FIG. 2.

FIG. 2 is a top plan layout view of an exemplary embodiment of an array substrate according to the present invention. FIG. 3a is a top plan layout view of an exemplary embodiment of an array substrate according to the present invention. FIG. 3b is a cross-sectional view taken along line III-III of FIG. 3a. FIG. 4 is a cross-sectional view taken along line IV-IV of FIG. 2. FIG. 5 is a cross-sectional view taken along line V-V of FIG. 2.

Referring to FIG. 2, a plurality of gate lines 121 and a plurality of storage capacitor lines 131, 135 are formed on an insulating substrate (110 as shown in FIG. 3B). The gate lines 121 extend in a first direction and transmit a gate signal. Each of the gate lines 121 includes a first gate electrode 124a and a second gate electrode 124b that protrude upwardly from the main portion of the gate line 121.

The storage capacitor line 131, 135 include a stem line 131 that extends in the first direction and a plurality of storage electrodes 135 that extend from the stem line 131. Although the stem and branch configuration is shown in FIG. 2, alternative exemplary embodiments include configurations wherein a shape and deposition of the storage line 131, 135 can be changed.

Referring to FIGS. 4 and 5, a gate insulation layer 140 is formed on the gate line 121 and the storage line 131, 135 in FIG. 2.

A plurality of semiconductor layers 154a and 154b are formed on the gate insulation layer 140. Exemplary embodiments of the semiconductor layers 154a, 154b may include amorphous silicon, polycrystalline silicon or other materials with similar characteristics.

A plurality of ohmic contact layers 163a, 165a, 165b are formed on the semiconductor layers 154a, 154b. Exemplary embodiments of the ohmic contact layers 163a, 165a and 165b may include silicide of metal or N+ amorphous silicon or other materials with similar characteristics.

A plurality of data lines 171a, 171b in FIG. 2, a first drain electrode 175a and a second drain electrode 175b are formed on the ohmic contact layers 163a, 165a, 165b and the gate insulation layer 140.

The data lines 171a, 171b extend in a second direction substantially perpendicular to the first direction. The data lines 171a, 171b transmit a data signal. The data lines 171a, 171b include a first source electrode 173a and a second source electrode 173b which, in one exemplary embodiment may be formed in a U-shape. The first source electrode 173a and the second source electrode 173b face the first drain electrode 175a and the second drain electrode 175b in an area corresponding to the first gate electrode 124a and the second gate electrode 124b, respectively.

The first TFT Qa and the second TFT Qb in FIG. 2 include the first and second gate electrodes 124a, 124b, the first and second source electrodes 173a, 173b and the first and second drain electrodes 175a, 175b, respectively.

The ohmic contact layers 163a, 165a, 165b are formed between the semiconductor layers 151a, 154b and the drain electrodes 175a, 175b to reduce contact resistance between the semiconductor layers 151a, 154b and the drain electrodes 175a, 175b.

A lower protection layer 180p is formed on the data lines 171a, 171b, the drain electrodes 175a, 175b and the semiconductor layers 154a, 154b. Exemplary embodiments of the lower protection layer 180p may include silicon nitride or silicon oxide or other materials with similar characteristics.

A light blocking member 220, as shown in FIG. 2, a spacing member 320 and a first color filter 230B, a second color filter 230R, and a third color filter 230G are formed on the lower protection layer 180p.

Referring to FIGS. 2 and 3a, the light blocking member 220 is formed along with the gate line 121 and the data lines 171a and 171b. Exemplary embodiments include configurations wherein a shape of the light blocking member 220 can be changed in accordance with a structure of a first, second and third pixel B, R, G, respectively. The light blocking member 220 includes a first portion 220a formed in alignment with the gate line 121 and the data lines 171a, 171b and a second portion 220b formed only in the second and third pixels R, G.

In one exemplary embodiment, the second portion 220b may be formed with a square ring shape in the second and third pixels R, G. In one exemplary embodiment, the second portion 220b may not be formed in the first pixel B. When the color filter is formed by an ink-jet process, a portion of the light blocking member 220 acts as a partition wall to confine the color filter as will be discussed in more detail below.

The spacing member 320 is formed in the first pixel B which does not include the second portion 220b of the light blocking member 220. The spacing member 320 is formed on the first color filter 230B of the first pixel B. In one exemplary embodiment, the spacing member 320 may include substantially the same material as the light blocking member 220.

In the present exemplary embodiment, the first color filter 230B of the first pixel B is formed by a photolithography process and the second and third color filters 230R, 230G are formed by an ink-jet process.

In one exemplary embodiment, a thickness of the first, second and third color filters 230R, 230G, 230B is not less than about 3 μm. Exemplary embodiments include configurations wherein a thickness of the first color filter 230B may be different from a thickness of the second and third color filters 230R, 230G.

Referring to FIGS. 3a and 3b, the first color filter 230B is formed by a photolithography process. The first portion of the light blocking member 220a covers a portion of the first color filter 230B. The spacing member 320 is formed on the first color filter 230B. When the third color filter 230G is formed by the ink-jet process, the light blocking member 220 acts as a partition wall to confine the third color filter 230G so that the third color filter 230G overlaps a portion of the light blocking member 220.

Referring back to FIGS. 4 and 5, an upper protection layer 180q is formed on the light blocking member 220 and the color filter 230. In one exemplary embodiment, the upper protection layer 180q may include a photosensitive organic material. In one exemplary embodiment, a thickness of the upper protection layer 180q is not less than about 1.0 μm so that a coupling effect between the pixel electrode 191 and the data lines 171a, 171b can be reduced or effectively prevented. The upper protection layer 180q can prevent the liquid crystal layer 3 from being contaminated due to a solvent flowing from the color filter 230.

With regard to the first pixel B including the first color filter 230B, which may be formed by the photolithography process, a first contact hole 185a and a second contact hole 185b are formed in the color filter 230B and the lower protection layer 180p so that a portion of the drain electrodes 175a, 175b is exposed.

With regard to the second and third pixels R, G including the second and third color filters 230R, 230G formed by the ink-jet process, third and fourth contact holes 185c, 185d are formed in the upper protection layer 180q and the lower protection layer 180p so that a portion of the drain electrodes 175a, 175b is exposed. The third and fourth contact holes 185c, 185d are formed in an inner area where the second portion 220b of the light blocking member 220 is surrounded by the second and third color filters 230R and 230G.

The sub-pixel electrodes 191a, 191b are formed on the upper protection layer 180q.

Referring back to FIG. 2, the pixel electrode 191 includes the first sub-pixel electrode 191a and the second sub-pixel electrode 191b that are divided by a gap 91.

In one exemplary embodiment, the first and second sub-pixel electrodes 191a, 191b may include a substantially square shape. In another exemplary embodiment, an area of the second sub-pixel electrode 191b may be bigger than an area of the first sub-pixel electrode 191a.

The first and second sub-pixel electrodes 191a, 191b are connected to the first and second drain electrodes 175a, 175b through the first and second contact holes 185a, 185b, respectively.

A lower alignment layer 11 is formed on the pixel electrode 191.

FIGS. 6a to 11b are cross-sectional views showing an exemplary embodiment of a method of manufacturing the exemplary embodiment of an array substrate of FIG. 2.

Referring to FIGS. 6a to 11, the gate line 121 including the gate electrodes 124a, 124b in FIG. 2 is formed on an insulation substrate 110, e.g., by forming a gate metal layer on the insulation substrate 110 and then patterning the gate metal layer to form the gate line 121 and the gate electrodes 124a and 124b. A gate insulation layer, an amorphous layer, an amorphous silicon layer doped with impurities and a data conductive layer are formed on the insulation substrate 110 having the gate line 121.

A photo-resist layer (not shown) is coated on the data conductive layer. A photosensitive pattern having different thicknesses may be formed by patterning the photo-resist layer using a slit mask.

The data conductive layer, the amorphous layer and the amorphous layer doped with impurities are patterned using the photosensitive pattern so that the semiconductor layer 154a, 154b, the ohmic contact layer 163a, 165a, 165b, the data lines 171a, 171b including the source electrodes 173a, 173b and the drain electrodes 175a, 175b are formed.

The lower protection layer 180p is formed on the data lines 171a, 171b, the drain electrodes 175a, 175b and the gate insulation layer 140.

Figure 6A:
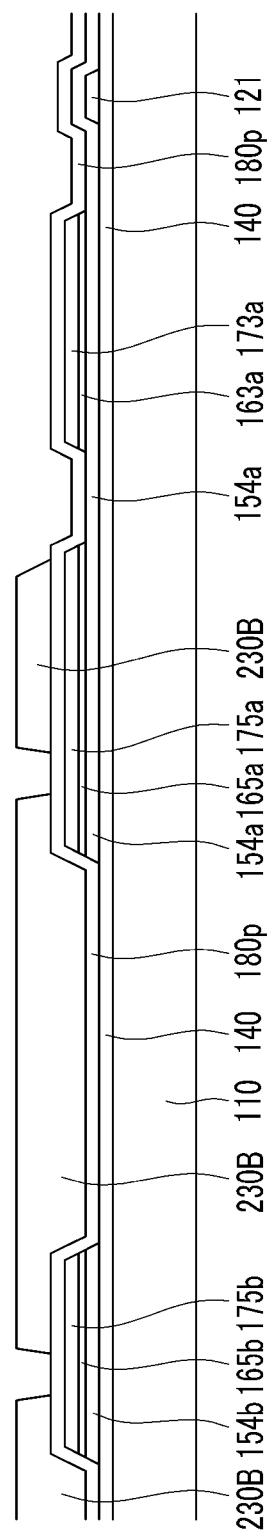
FIGS. 6a to 11b are cross-sectional views illustrating an exemplary embodiment of a method of manufacturing an exemplary embodiment of an array substrate of FIG. 2.
Figure 6B:
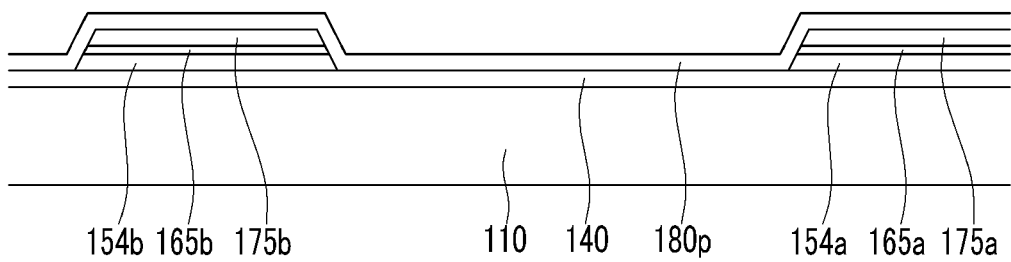

Referring to FIGS. 6a and 6b, the first color filter 230B is formed on the lower protection layer 180p and is formed in the first pixel B. In the present exemplary embodiment, the first color filter 230B is formed by exposing and developing a photosensitive organic material layer using a photo mask. A portion of the first color filter 230B is removed to form the contact holes 185a, 185b.

Figure 7A:
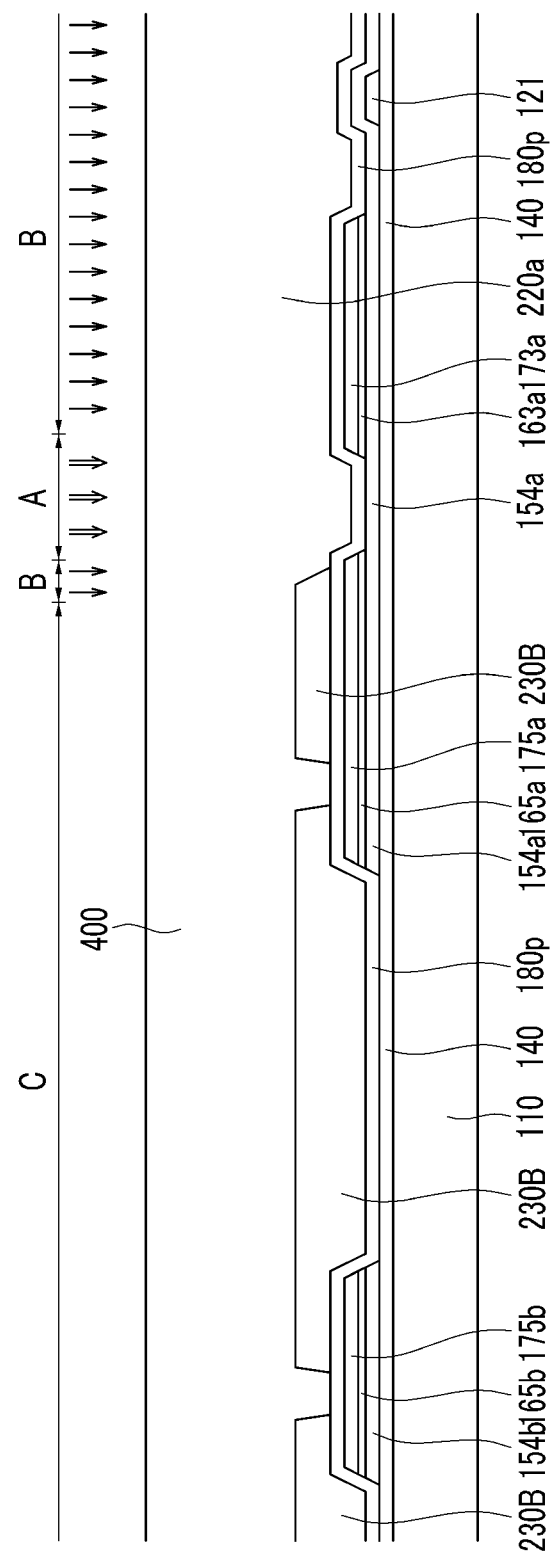
Figure 7B:
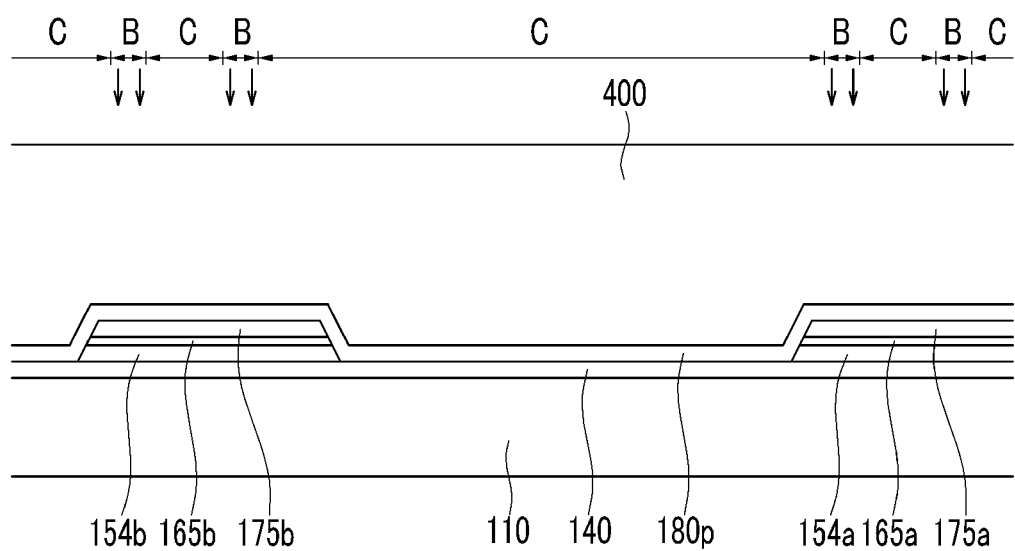

Referring to FIGS. 7a and 7b, a photosensitive resist 400 including a black pigment is coated on the insulation substrate 110. The photosensitive resist 400 is patterned using an exposure mask having a transparent area A, a translucent area B and a light blocking area C so that the photosensitive resist 400 may have different thicknesses corresponding to the areas A, B, C of the exposure mask. Exemplary embodiments of the translucent area B of the photosensitive resist 400 may include a slit pattern, a lattice pattern or a thin film adjusted by a transmission rate or a thickness.

When the photosensitive resist 400 includes a negative photosensitive property, the transparent area A corresponds to an area where the spacing member 320 is formed, the translucent area B corresponds to an area where the light blocking member 220 is formed and the light blocking area C corresponds to an area where the spacing member 320 and the light blocking member 220 are not formed.

In the present exemplary embodiment, the spacing member 320 and the light blocking member 220 are formed simultaneously.

In an exemplary embodiment, when the photosensitive resist 400 includes a positive photosensitive property, the light blocking area corresponds to an area where the spacing member 320 is formed.

Figure 8A:
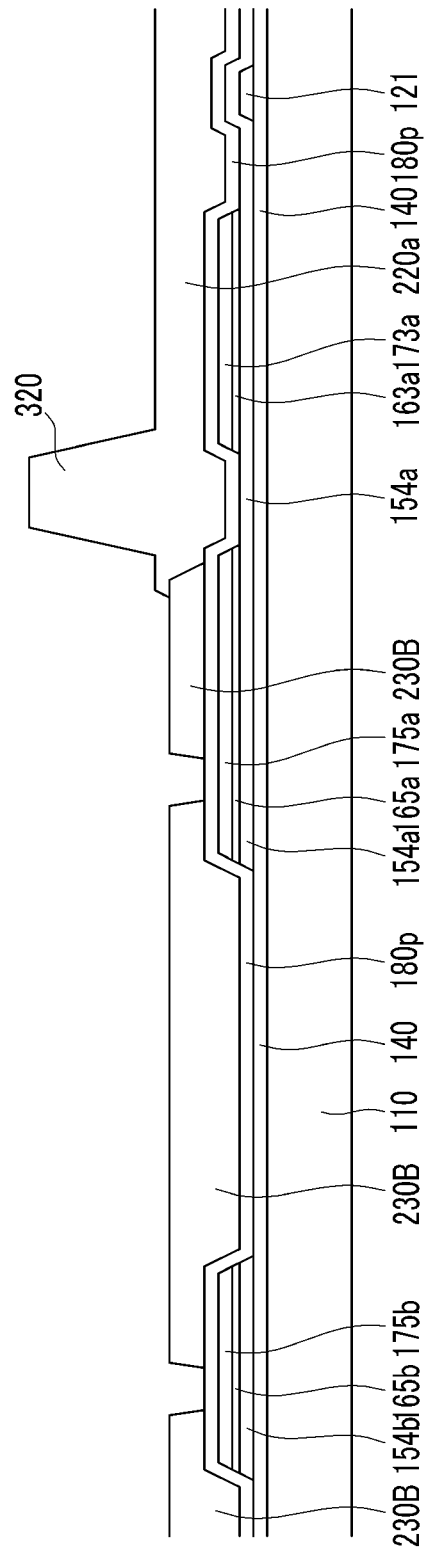
Figure 8B:
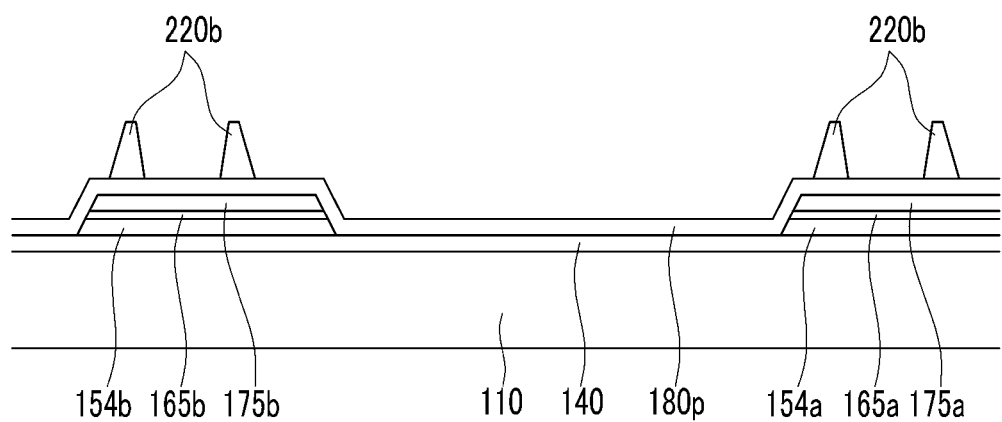

Referring to FIGS. 8a and 8b, the spacing member 320 is formed on the first color filter 230B which is formed by the photolithography process. The second portion 220b of the light blocking member 220 is formed in the second and third pixels R, G by the photolithography process.

In the present exemplary embodiment, the second and third color filters 230R, 230G in the second and third pixels R, G are formed by the ink-jet process.

Figure 9:
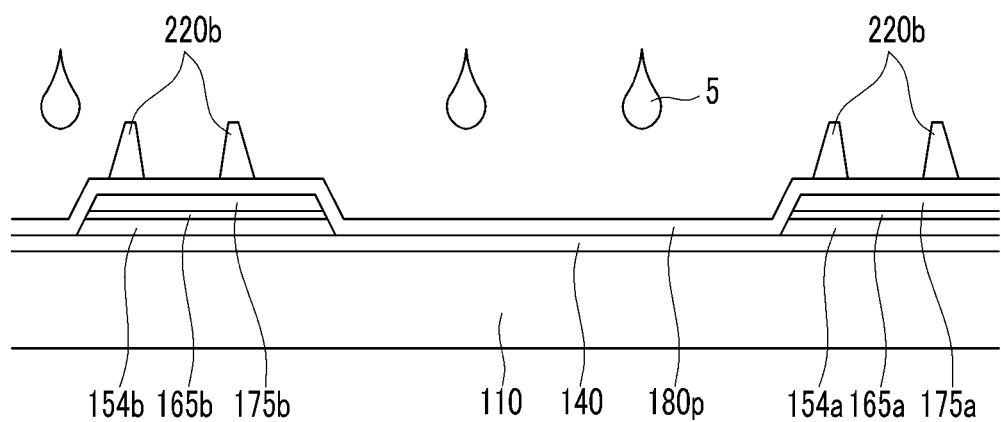

Referring to FIG. 9, an ink droplet 5 for forming a color filter is dropped from a nozzle of a head (not shown) into an opening area between the first portion 220a of the light blocking member 220 and the second portion 220b of the light blocking member 220.

Figure 10:
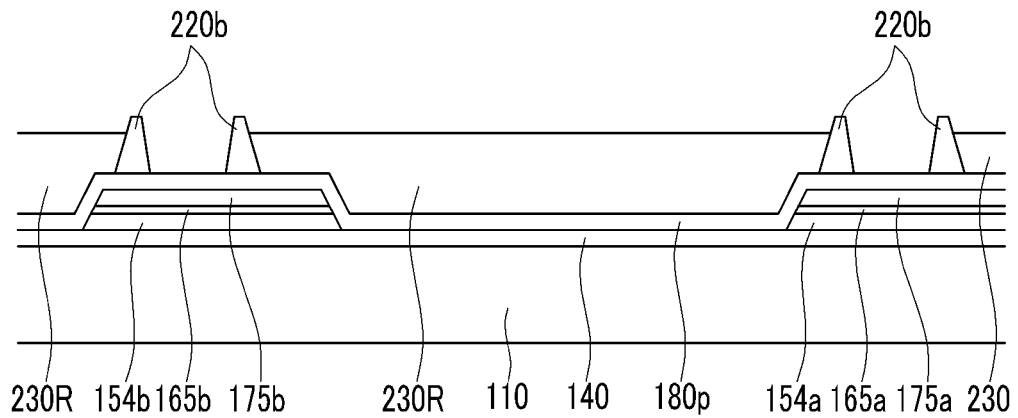

Referring to FIG. 10, the second and third color filters 230R, 230G in the second and third pixels R, G are formed after the dropped ink 5 is dried.

The second and third color filters 230R, 230GA are not formed in an inner area where the second portion 220b of the light blocking member 220 is surrounded.

Figure 11A:
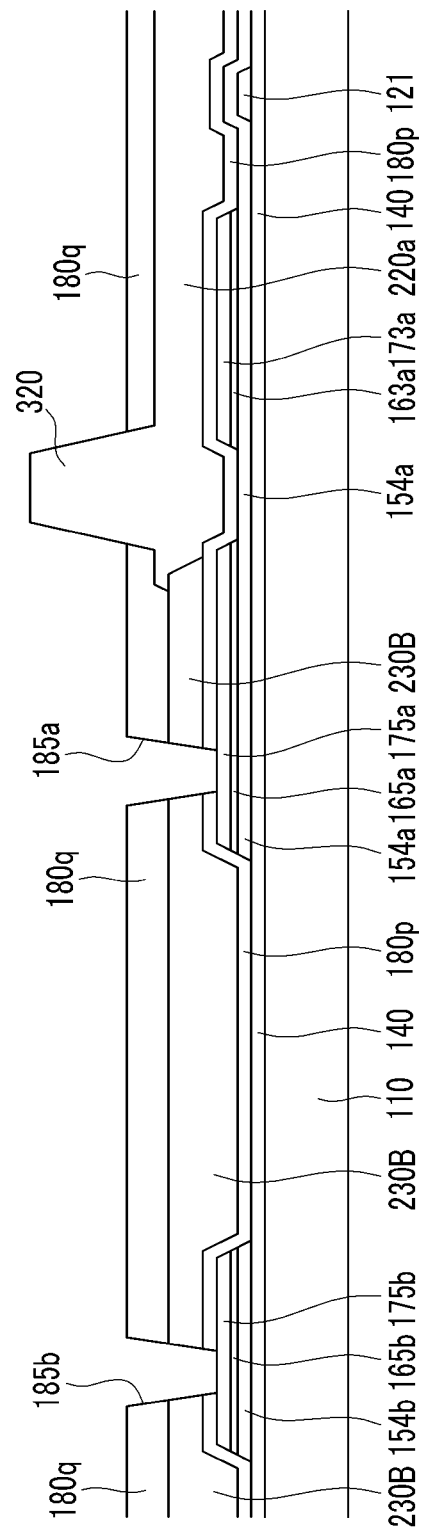
Figure 11B:
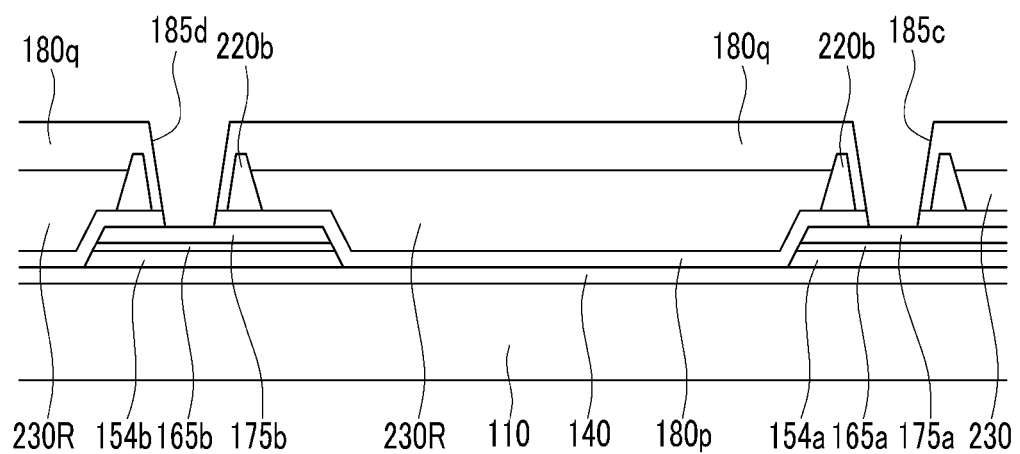

Referring to FIGS. 11a and 11b, the upper protection layer 180q is formed on the color filter 230. The third and fourth contact holes 185c, 185d are formed by patterning the upper protection layer 180q and the lower protection layer 180p.

Referring back to FIGS. 4 and 5, the pixel electrode 191 is formed on the upper protection layer 180q. The alignment layer 11 is then formed on the pixel electrode 191.

In another exemplary embodiment, first and second color filters are formed by a photolithography process similar to the process described for forming the first color filter in the exemplary embodiment described above, and a third color filter is formed by an ink-jet process.

According to the above-described exemplary embodiments, a first color filter is formed by a photolithography process and second and third color filters are formed by an ink-jet process so that a light blocking member and a spacing member can be formed simultaneously. Therefore, a manufacturing time and a manufacturing cost can be reduced.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. An array substrate comprising:
a substrate;
a gate line and a data line disposed on the substrate;
a thin film transistor electrically connected to the gate line and the data line;
a light blocking member disposed on the substrate; and
a first color filter and a second color filter disposed on the substrate,
wherein a portion of the light blocking member is disposed over a portion of the first color filter and a portion of the second color filter is disposed over a portion of the light blocking member, and
wherein a portion of the thin film transistor is disposed between the substrate and at least one of the first color filter and the second color filter.

2. The array substrate of claim 1, further comprising:
a spacing member disposed on at least one of the first color filter and second color filter,
wherein the spacing member comprises substantially the same material as the light blocking member.

3. The array substrate of claim 2, wherein the first color filter is formed by a photolithography process and the spacing member is disposed on at least a portion of the first color filter.

4. The array substrate of claim 2, further comprising:
a protection layer disposed on the light blocking member, the first color filter and second color filter; and
a pixel electrode disposed on the protection layer,
wherein the pixel electrode is connected to the thin film transistor.

5. The array substrate of claim 4, wherein the pixel electrode comprises:
a first pixel electrode connected to the thin film transistor through a first contact hole which penetrates the protection layer without penetrating a color filter; and
a second pixel electrode connected to a second thin film transistor through a second contact hole which penetrates the first color filter and the protection layer.

6. The array substrate of claim 5, wherein the second color filter is formed by an ink-jet process and fills an inner area surrounded by the light blocking member, and
wherein the light blocking member comprises a first portion disposed along the gate line and the data line, and a second portion surrounding the first contact hole.

7. The array substrate of claim 6, wherein the second portion has a square ring shape and the second color filter is not disposed in an inner area of the square ring shape.

8. The array substrate of claim 1, further comprising:
a protection layer disposed on the light blocking member, the first color filter and second color filter; and
a pixel electrode disposed on the protection layer, wherein the pixel electrode is connected to the thin film transistor.

9. The array substrate of claim 8, wherein the pixel electrode comprises:
a first pixel electrode connected to the thin film transistor through a first contact hole which penetrates the protection layer without penetrating a color filter; and
a second pixel electrode connected to a second thin film transistor through a second contact hole which penetrates the first color filter and the protection layer.

10. The array substrate of claim 9, wherein the second color filter is formed by an ink-jet process and fills an inner area surrounded by the light blocking member, and
wherein the light blocking member comprises a first portion disposed along the gate line and the data line, and a second portion surrounding the first contact hole.

11. An array substrate comprising:
a substrate;
a gate line and a data line disposed on the substrate;
a thin film transistor electrically connected to the gate line and the data line;
a light blocking member disposed on the substrate;
a plurality of color filters disposed on the substrate; and
a spacing member disposed on a first group of the color filters,
wherein a second group of the color filters is formed by an ink-jet process and fills an area bound by the light blocking member thereby a portion of the second group of the color filters is disposed over the light blocking member, and the spacing member is contiguous with the light blocking member, and
wherein a portion of the thin film transistor is disposed between the substrate and at least one of a first color filter and a second color filter.

12. The array substrate of claim 11, wherein the first group of the color filters is formed by a photolithography process.

* * * * *